(12) United States Patent
Park

(10) Patent No.: US 11,329,004 B2
(45) Date of Patent: May 10, 2022

(54) SEMICONDUCTOR PACKAGE

(71) Applicant: SAMSUNG ELECTRONICS CO., LTD., Suwon-si (KR)

(72) Inventor: Jieun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 184 days.

(21) Appl. No.: 16/591,119

(22) Filed: Oct. 2, 2019

(65) Prior Publication Data

US 2020/0194381 A1 Jun. 18, 2020

(30) Foreign Application Priority Data

Dec. 14, 2018 (KR) .................. 10-2018-0161984

(51) Int. Cl.
*H01L 23/552* (2006.01)
*H01L 23/00* (2006.01)
*H01L 23/31* (2006.01)
*H01L 23/495* (2006.01)

(52) U.S. Cl.
CPC ........ *H01L 23/552* (2013.01); *H01L 23/3157* (2013.01); *H01L 23/49527* (2013.01); *H01L 23/49534* (2013.01); *H01L 23/49586* (2013.01); *H01L 24/09* (2013.01); *H01L 2224/02372* (2013.01); *H01L 2224/02377* (2013.01); *H01L 2224/02379* (2013.01)

(58) Field of Classification Search
None
See application file for complete search history.

(56) References Cited

U.S. PATENT DOCUMENTS

| 2005/0258548 | A1 | 11/2005 | Ogawa et al. |
| 2010/0220448 | A1 | 9/2010 | Nomura |
| 2015/0115467 | A1* | 4/2015 | Park ............. H01L 25/50 257/774 |
| 2017/0207205 | A1* | 7/2017 | Kim ............. H01L 21/486 |
| 2018/0068978 | A1* | 3/2018 | Jeng ............. H01L 24/02 |
| 2018/0138029 | A1 | 5/2018 | Kim et al. |
| 2020/0035625 | A1* | 1/2020 | Wang ............. H01Q 21/062 |

FOREIGN PATENT DOCUMENTS

| JP | 2000-349225 A | 12/2000 |
| JP | 4329884 B2 | 9/2009 |
| KR | 10-2018-0055570 A | 5/2018 |

* cited by examiner

*Primary Examiner* — Vongsavanh Sengdara
(74) *Attorney, Agent, or Firm* — Sughrue Mion, PLLC

(57) ABSTRACT

A semiconductor package includes a connection structure having including a plurality of insulating layers and redistribution layers on the plurality of insulating layers. A semiconductor chip has connection pads connected to the redistribution layers, and an encapsulant encapsulates the semiconductor chip. A passive component is embedded in the connection structure and has connection terminals connected to the redistribution layer. The redistribution layers include a plurality of redistribution patterns, each disposed on the plurality of insulating layers and a plurality of redistribution vias each penetrating through the plurality of insulating layers and connected to the plurality of redistribution patterns. The plurality of redistribution vias include a plurality of blocking vias arranged to surround the passive component, and the plurality of redistribution patterns include a blocking pattern connected to adjacent blocking vias.

20 Claims, 13 Drawing Sheets

I-I'

II-II'

II-II'

SEMICONDUCTOR PACKAGE

CROSS-REFERENCE TO RELATED APPLICATION(S)

This application claims benefit of priority to Korean Patent Application No. 10-2018-0161984 filed on Dec. 14, 2018 in the Korean Intellectual Property Office, the disclosure of which is incorporated herein by reference in its entirety.

BACKGROUND

1. Field

The present disclosure relates to a semiconductor package.

2. Description of Related Art

In accordance with an increase in a size of displays for mobile apparatuses, continued efforts are being made to increase the capacity of batteries. In accordance with the increase in the capacity of batteries, areas occupied by the batteries in mobile apparatuses have increased, and efforts are thus being made to reduce a size of a printed circuit board (PCB). Therefore, an area in which components are mounted can be reduced, such that interest in modularization has continuously increased.

Meanwhile, an example of the related art of mounting a plurality of components may include chip-on-board (COB) technology. A COB mounting method is a method of mounting individual passive components and a semiconductor package on a printed circuit board using surface mounting technology (SMT). However, in such a method, a wide mounting area is generally required in order to maintain a minimum interval between components, electromagnetic interference (EMI) between the components is high, and a distance between the semiconductor chip and the passive components is great such that electric noise is increased.

SUMMARY

An aspect of the present disclosure may provide a semiconductor package in which electromagnetic interference (EMI) due to a component embedded in a connection structure may be effectively blocked.

According to an aspect of the present disclosure, a semiconductor package may include a connection structure having a first surface and a second surface opposing each other and including a plurality of insulating layers and redistribution layers disposed on the plurality of insulating layers, and a semiconductor chip disposed on the first surface of the connection structure and having connection pads connected to the redistribution layers. An encapsulant is disposed on the first surface of the connection structure and encapsulates the semiconductor chip. A passive component is embedded in the connection structure and has connection terminals connected to the redistribution layer. The redistribution layers include a plurality of redistribution patterns, each disposed on a respective insulating layer of the plurality of insulating layers, and a plurality of redistribution vias each penetrating through a respective insulating layer of the plurality of insulating layers and connected to the redistribution patterns of plurality of redistribution patterns. The plurality of redistribution vias include a plurality of blocking vias arranged to surround the passive component, and the plurality of redistribution patterns include a blocking pattern connected to adjacent blocking vias.

According to another aspect of the present disclosure, a semiconductor package may include a substrate having an interconnection structure and having a cavity, and a bridge disposed in the cavity and including a connection structure and a passive component, the connection structure including a plurality of insulating layers and redistribution layers disposed on the plurality of insulating layers, and the passive component being embedded in the connection structure and having connection terminals connected to the redistribution layer. First and second semiconductor chips are each disposed on the substrate to be connected to the interconnection structure of the substrate and electrically connected to each other through the redistribution layers of the bridge. The redistribution layers include a plurality of redistribution patterns, each disposed on a respective insulating layer of the plurality of insulating layers, and a plurality of redistribution vias each penetrating through a respective insulating layer of the plurality of insulating layers and connected to the plurality of redistribution patterns. The plurality of redistribution vias include a plurality of blocking vias arranged to surround the passive component, and the plurality of redistribution patterns include blocking patterns connected to adjacent blocking vias in the plurality of insulating layers.

According to a further aspect of the present disclosure, a connection structure has opposing first and second surfaces and is configured to have a semiconductor chip mounted on the first surface thereof. The connection structure may include a plurality of insulating layers sequentially stacked between the first and second surfaces, a plurality of redistribution layers including redistribution patterns disposed between respective insulating layers of the plurality of insulating layers, and a plurality of redistribution vias extending through respective insulating layers of the plurality of insulating layers to interconnect distribution layers of the plurality of redistribution layers. The connection structure includes a cavity disposed between the first and second surfaces and extending through at least first and second insulating layers of the plurality of insulating layers to have a passive component disposed therein, and redistribution patterns disposed adjacent to the cavity on each of the first and second insulating layers are connected to each other by redistribution vias of the plurality of redistribution vias.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. The terms may be used for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
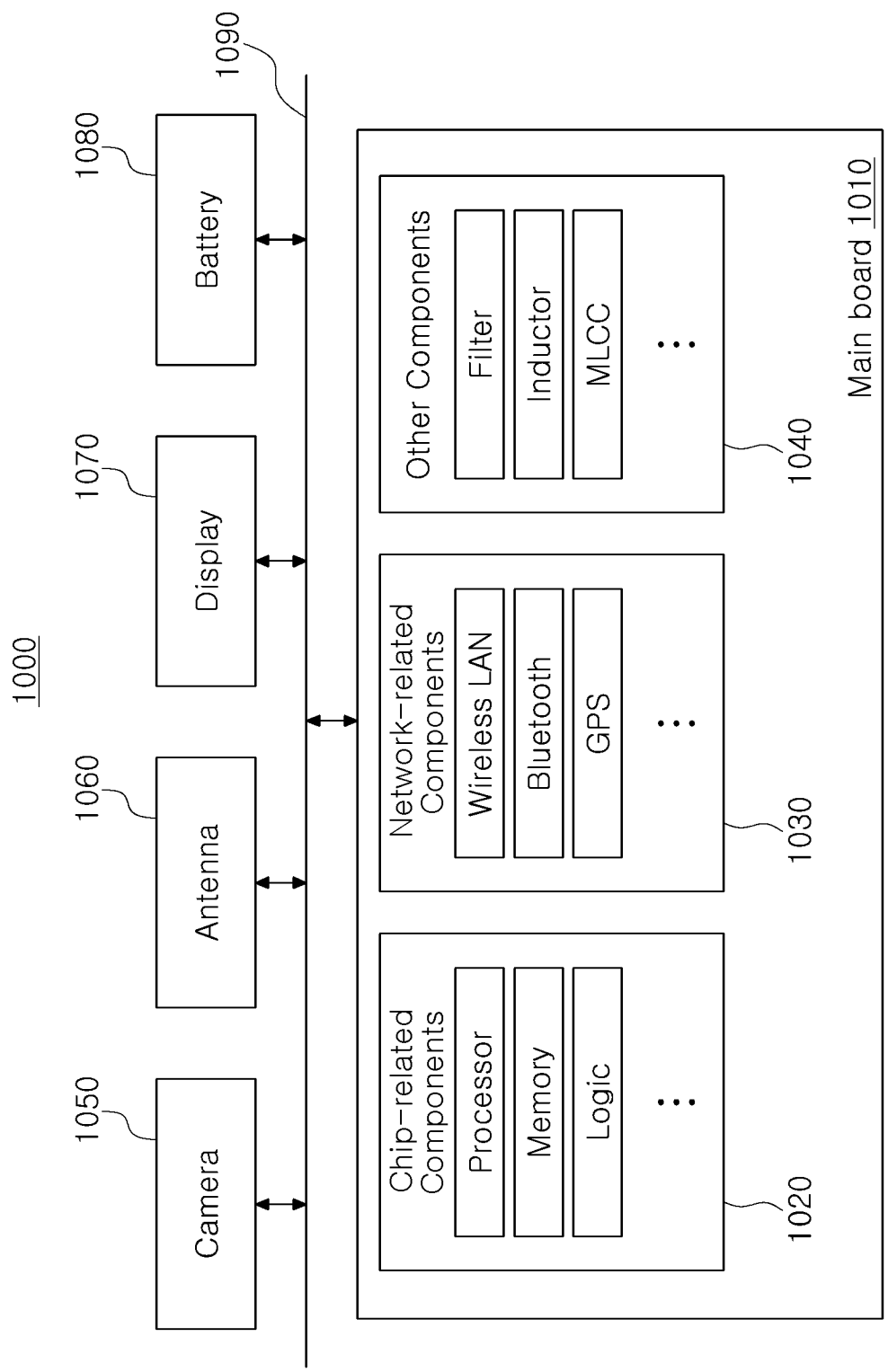
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
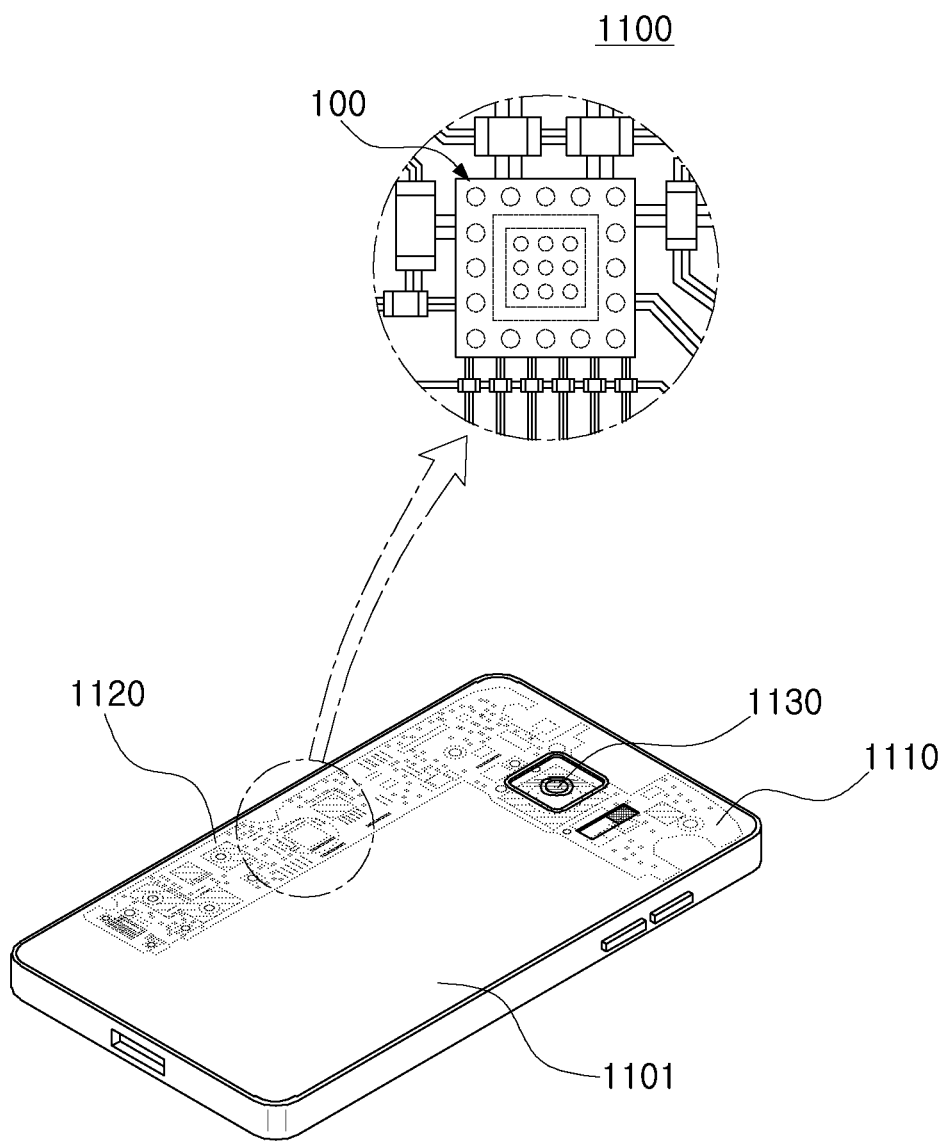
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is used is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is advantageously used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
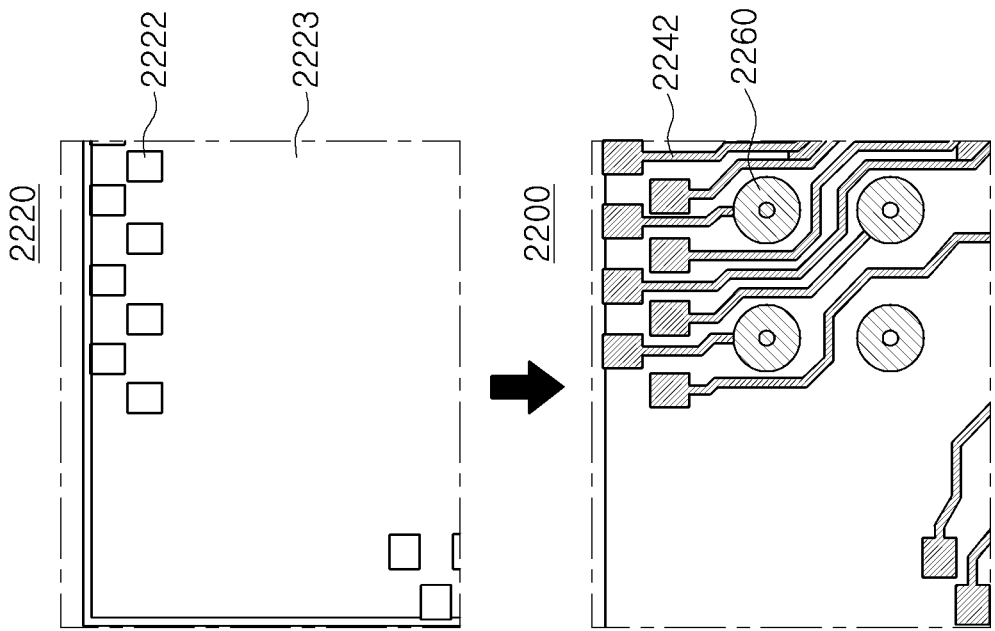
FIGS. 3A and 3B are schematic cross-sectional views illustrating a fan-in semiconductor package before and after being packaged.
Figure 3A:
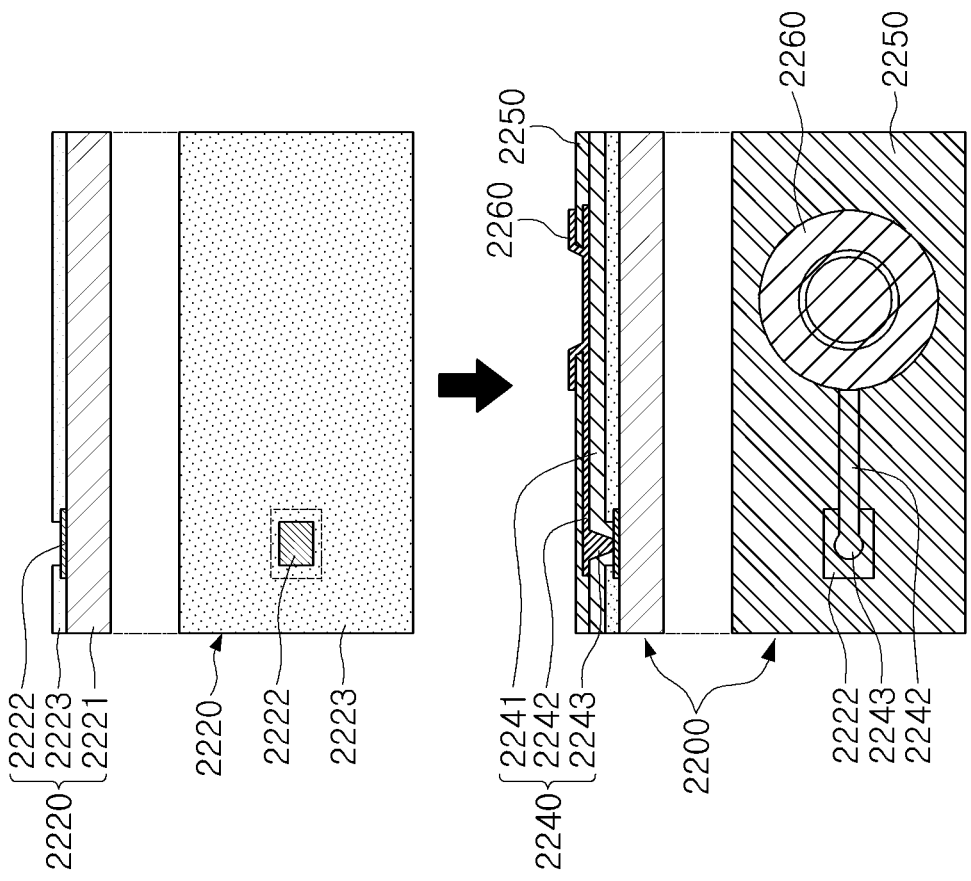
Figure 4:
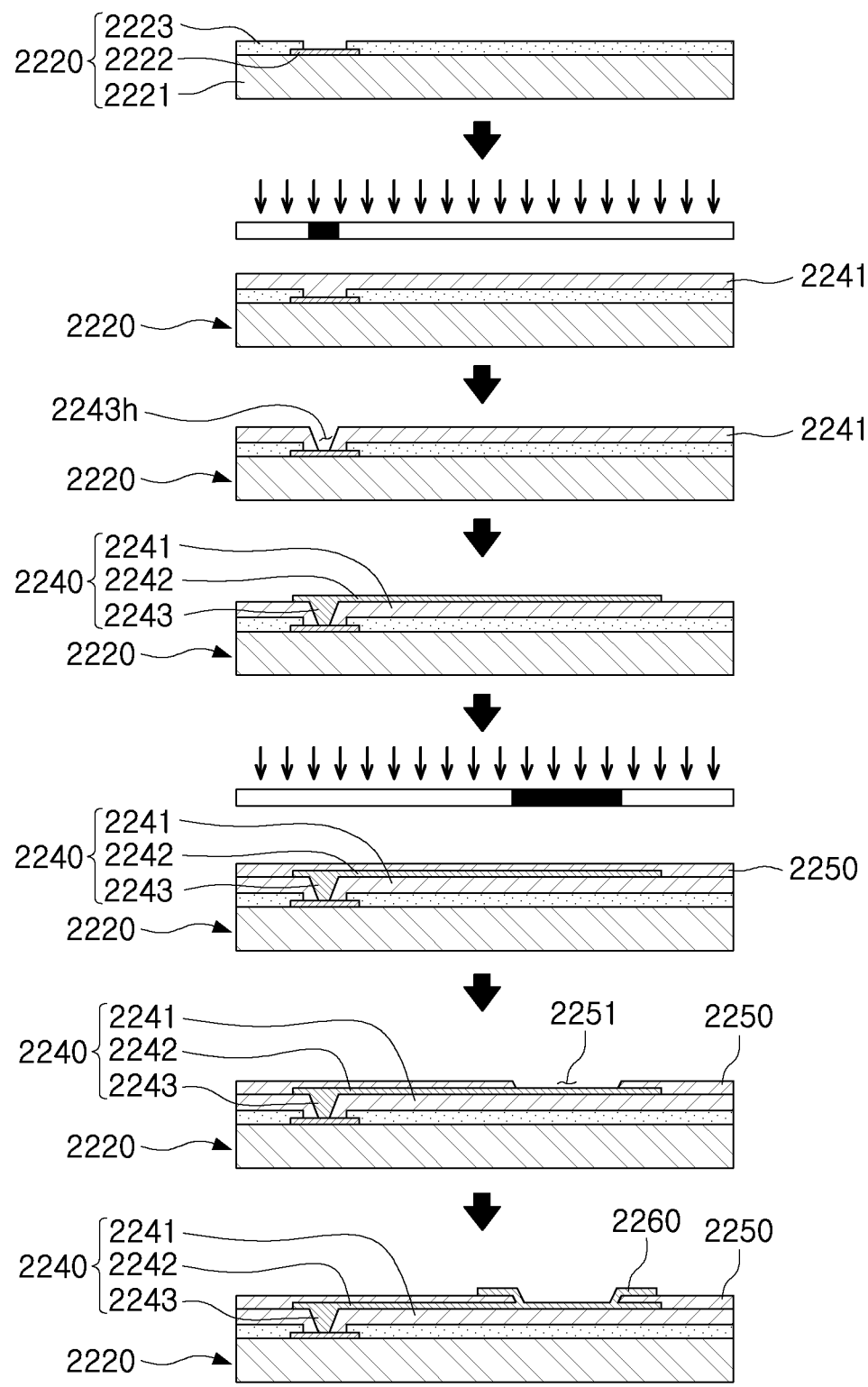
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243*h* opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
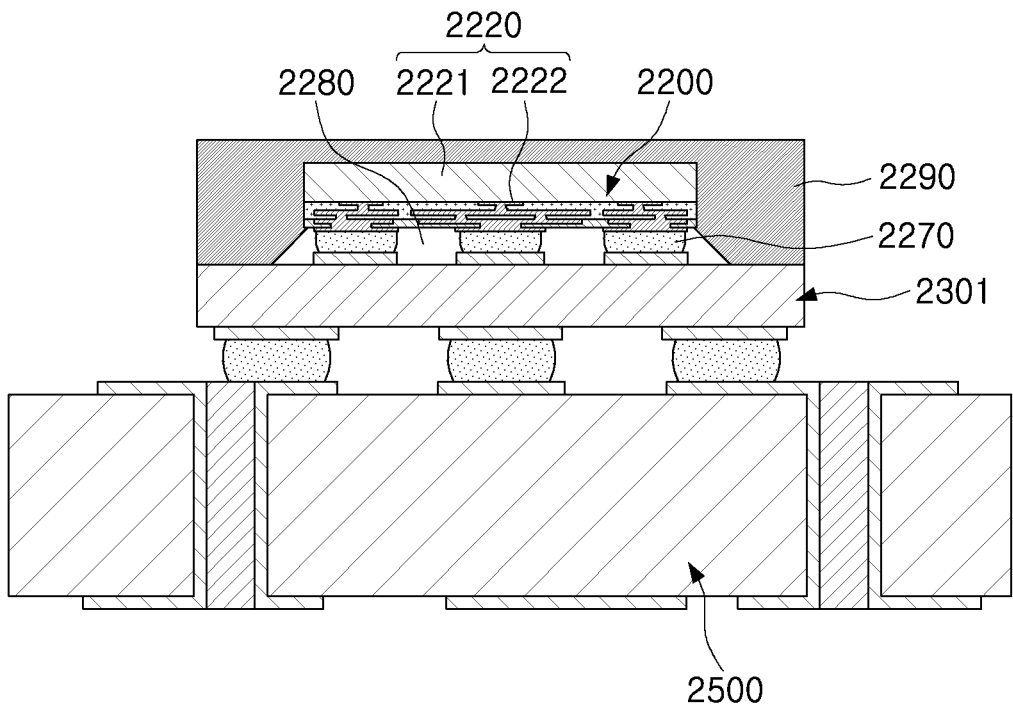
FIG. 5 is a schematic cross-sectional view illustrating a fan-in semiconductor package mounted on an interposer substrate and ultimately mounted on a mainboard of an electronic device.
Figure 6:
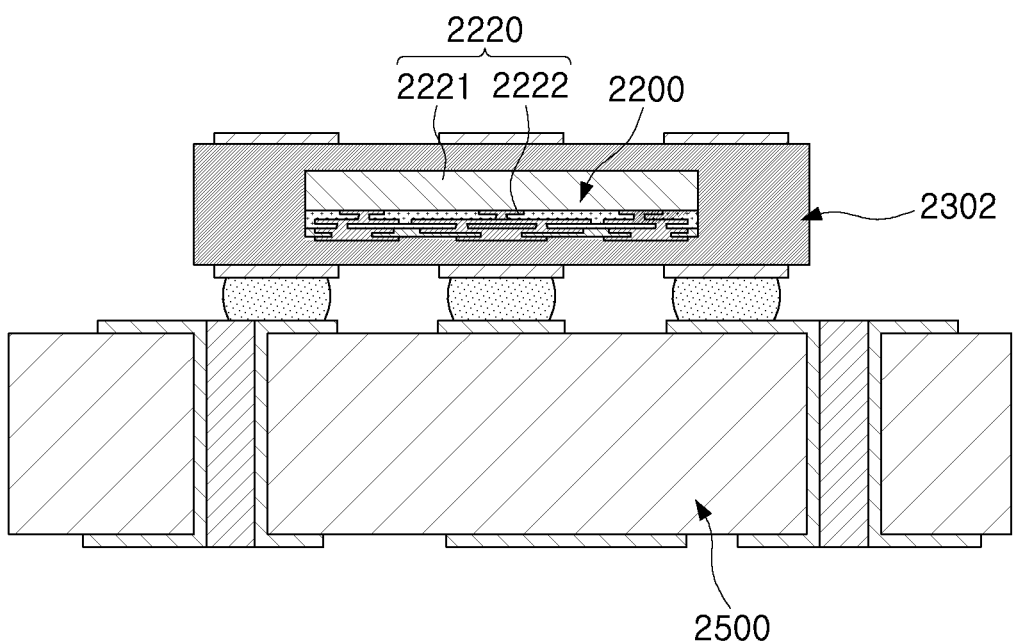
FIG. 6 is a schematic cross-sectional view illustrating a fan-in semiconductor package embedded in an interposer substrate and ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
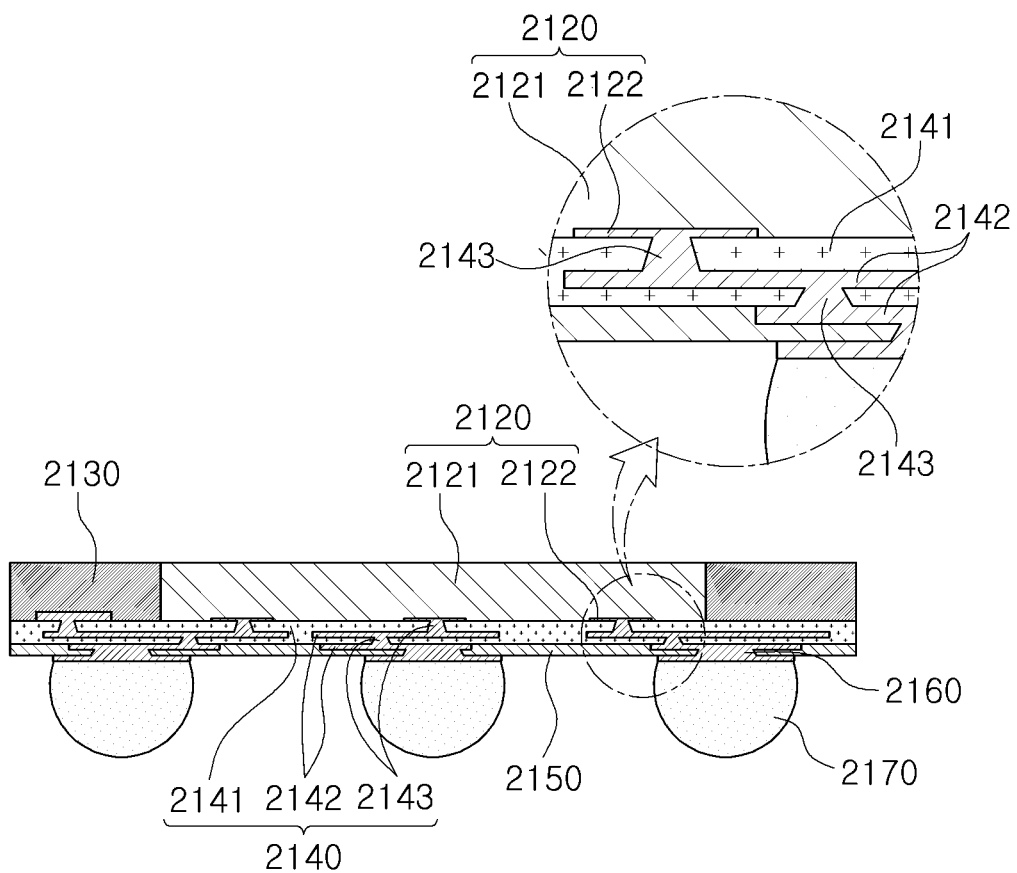
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2202, and an underbump metal layer 2202 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, a process for the connection structure 2140 is performed from the via connecting the redistribution layers and the connection pads 2122 of the semiconductor chip 2120 to each other and the redistribution layers, and the vias 2143 may thus have a width that becomes small as they become to the semiconductor chip (see an enlarged region).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
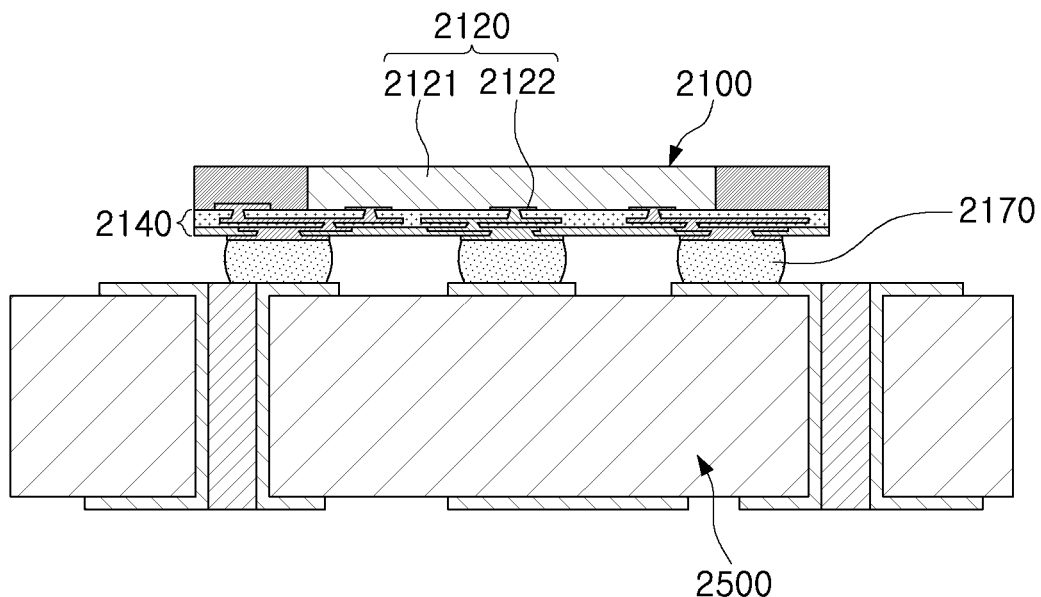
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in detail with reference to the accompanying drawings.

Figure 9:
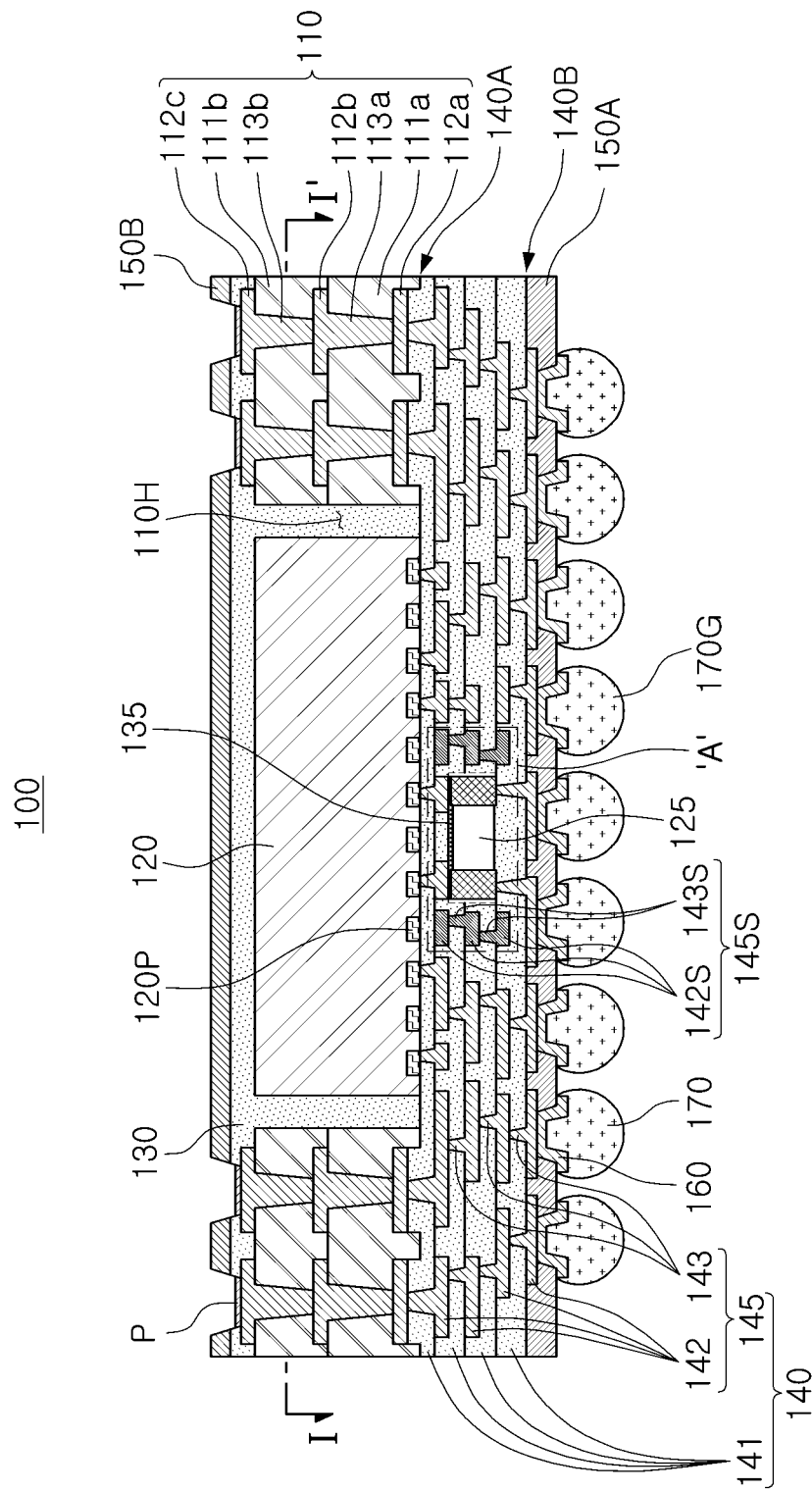
FIG. 9 is a schematic cross-sectional view illustrating a semiconductor package according to another exemplary embodiment in the present disclosure.
Figure 10:
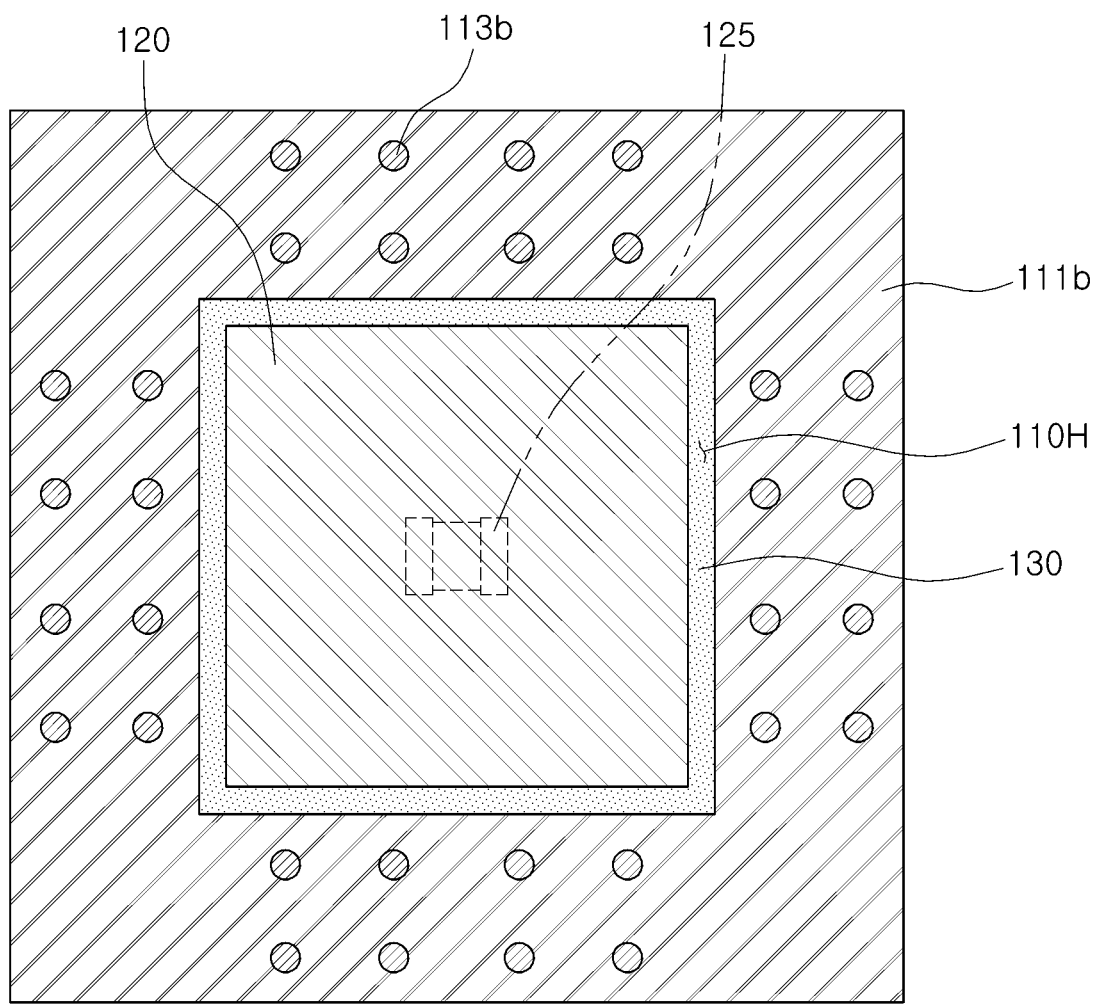
FIG. 10 is a plan view taken along line I-I' of the semiconductor package of FIG. 9.

FIG. 9 is a schematic cross-sectional view illustrating a semiconductor package according to an exemplary embodiment, and FIG. 10 is a plan view taken along line I-I' of the semiconductor package of FIG. 9.

Referring to FIG. 9, a semiconductor package 100 according to the present exemplary embodiment may include a connection structure 140 having a first surface 140A and a second surface 140B opposing each other, a semiconductor chip 120 disposed on the first surface 140A of the connection structure 140, and an encapsulant 130 disposed on the first surface 140A of the connection structure 140 and encapsulating the semiconductor chip 120.

The connection structure 140 may include a plurality of insulating layers 141 and redistribution layers 145 disposed on the plurality of insulating layers 141. In the present exemplary embodiment, a case in which the number of insulating layers 141 is four is exemplified, and a case in which the redistribution layers 145 have a four-level structure is exemplified. Connection pads 120P of the semiconductor chip 120 disposed on the first surface 140A of the connection structure may be connected to the redistribution layer 145. The redistribution layers 145 may include a plurality of redistribution patterns 142 each disposed on the plurality of insulating layers 141 and a plurality of redistribution vias 143 each penetrating through the plurality of insulating layers 141 and connected to the plurality of redistribution patterns 142.

The semiconductor package according to the present exemplary embodiment may further include a frame 110 disposed on the first surface 140A of the connection structure 140. The semiconductor chip 120 may be accommodated in a through-hole 110H of the frame 110. The frame 110 may have a wiring structure including three wiring patterns 112a, 112b, and 112c and wiring vias 113a and 113b connecting the three wiring patterns 112a, 112b, and 112c to each other. The wiring structure of the frame 110 may be electrically connected to the redistribution layer 145 of the connection structure 140. In the present exemplary embodiment, a first wiring pattern 112a and the redistribution vias 143 may be connected to each other (e.g., in contact with each other).

At least one passive component 125 may be embedded in the connection structure 140 used in the present exemplary embodiment. The passive component 125 may have connection terminals 125P (see, e.g., FIG. 11) connected to the redistribution layer 145.

Figure 11:
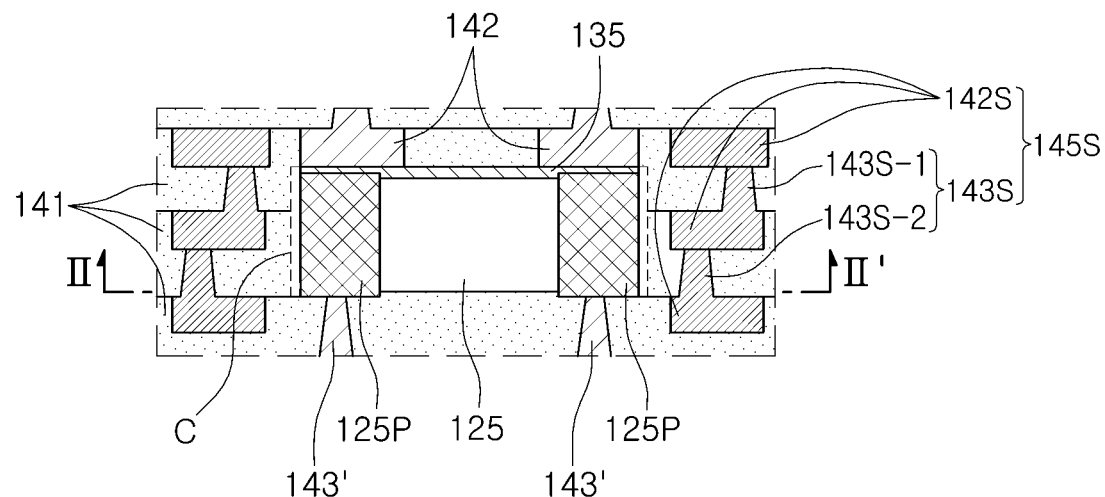
FIG. 11 is an enlarged cross-sectional view of region "A" of the semiconductor package of FIG. 9.

As illustrated in FIG. 11, the redistribution layer 145 may include blocking wiring structures 145S disposed to surround a cavity (denoted by a dotted line) within which the passive component 125 is disposed. FIG. 11 is an enlarged cross-sectional view of region "A" of the semiconductor package of FIG. 9.

The blocking wiring structures 145S used in the present exemplary embodiment may be arranged to surround the passive component 125 embedded in the connection structure 140 in order to block electromagnetic interference (EMI). The blocking wiring structures 145S may include a plurality of blocking vias 143S disposed to surround the cavity and blocking patterns 142S connecting adjacent blocking vias to each other.

The plurality of blocking vias 143S, which are some of the plurality of redistribution vias 143, may be formed together with redistribution vias disposed on the same level. The blocking patterns 142S, which are some of the plurality of redistribution patterns 142, may also be formed together with redistribution patterns disposed on the same level.

In the present exemplary embodiment, a form in which first and second blocking vias 143S-1 and 143S-2 are stacked as a two-level structure is illustrated, but three or more blocking vias may also be stacked depending on a thickness of the passive component 125.

The redistribution layer 145 formed in the connection structure 140 may include ground patterns (not illustrated), and the blocking vias 143S or the blocking patterns 142S may be connected to the ground patterns (not illustrated) by another redistribution layer 145.

As illustrated in FIG. 11, the plurality of blocking vias 143S may be arranged to be offset from each other. In detail, the plurality of blocking vias 143S may be arranged so that the centers of blocking vias 143S disposed on adjacent and different insulating layers 141 are offset from each other. For example, the blocking vias 143S may not be aligned with each other.

The connection terminals 125P of the passive component 125 may be connected to redistribution vias 143' disposed on (e.g., extending through) an insulating layer 141 adjacent to one surface of the passive component 125 among the plurality of insulating layers 141 to be connected to the redistribution layer 145. In the present exemplary embodiment, the connection terminals 125P of the passive component 125 are connected to the redistribution layer 145 by the redistribution vias 143', but the passive component may alternatively or additionally be mounted to be connected to the redistribution patterns 142. The other surface of the passive component 125 may be bonded to an insulating layer 141 adjacent thereto by an adhesive layer 135.

Figure 13:
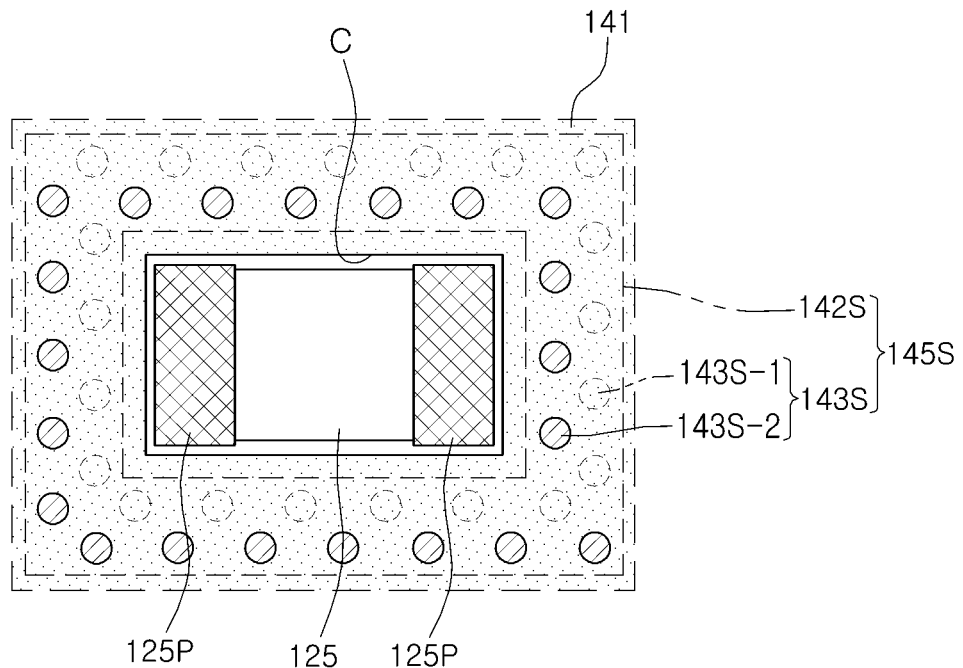
FIGS. 13 and 14 are plan views illustrating various arrays of blocking vias and blocking patterns that may be used in the semiconductor packages according to an exemplary embodiments in the present disclosure.

FIG. 13, which is a plan view taken along line II-II' of a portion illustrated in FIG. 11, illustrates arrays of the blocking vias 143S and the blocking patterns 142S that may be used in the semiconductor package.

Referring to FIG. 13, the blocking patterns 142S may be a continuous single pattern surrounding (e.g., extending continuously around an entire periphery of) the cavity C in which the passive component 125 is disposed. Blocking vias 143S-1 and 143S-2 disposed on adjacent insulating layers 141 may be offset from each other to be arranged in a zigzag form.

Figure 12:
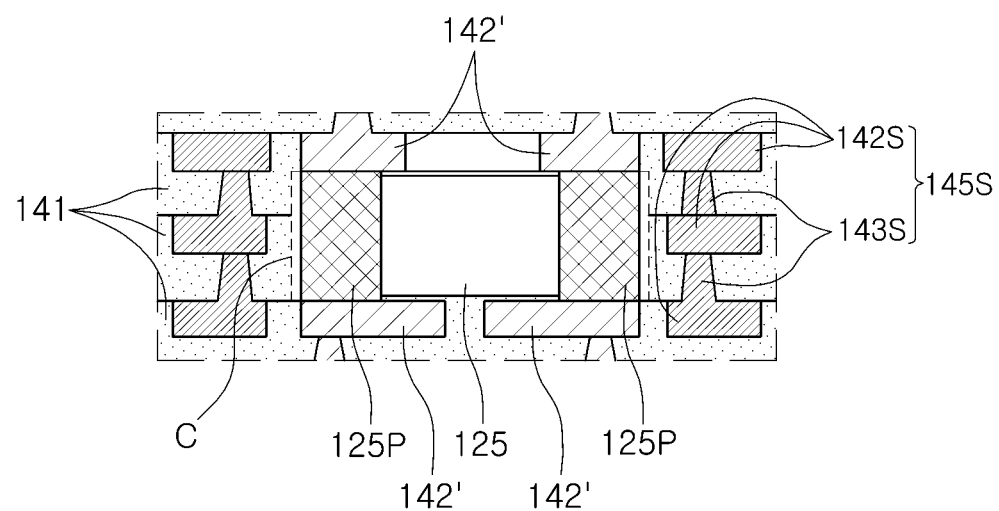
FIG. 12 is a cross-sectional view illustrating another example of a blocking structure that may be used in the semiconductor package according to an exemplary embodiment in the present disclosure.
Figure 14:
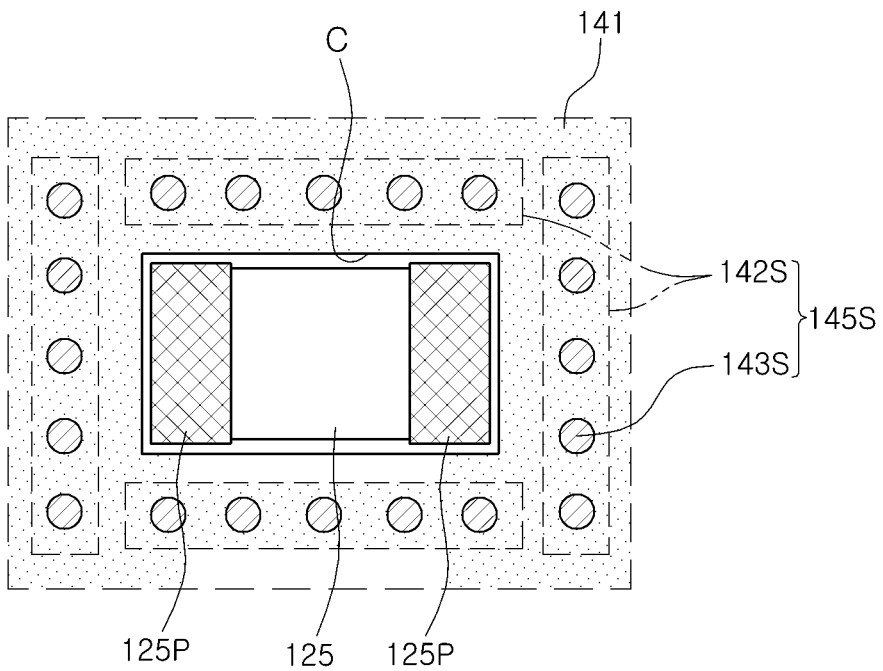

FIG. 12 is a cross-sectional view illustrating another example of a blocking structure that may be used in the semiconductor package according to an exemplary embodiment in the present disclosure, and may be understood as an enlarged view of region "A" of FIG. 9, similar to FIG. 11. FIG. 14 is a plan view taken along line II-II' of a portion illustrated in FIG. 12.

Referring to FIG. 12, blocking vias 143S disposed on adjacent insulating layers 141 may be arranged to overlap each other (e.g., to be aligned with each other in a stacking direction), unlike the previous exemplary embodiment. In the present exemplary embodiment, the connection terminals 125P of the passive component 125 may be connected to the redistribution layers 145 by redistribution patterns 142' positioned on upper and lower surfaces thereof and contacting the connection terminals 125P. In another exemplary embodiment, the connection terminals 125P of the passive component 125 may be connected to only redistribution patterns 142' positioned on one of the upper and lower surfaces thereof, or may be connected to the redistribution layer 145 through redistribution vias rather than the redistribution patterns 142', similar to the previous exemplary embodiment.

Referring to FIG. 14, the blocking pattern 142S may also include a plurality of patterns 142S or segments arranged to surround the cavity C in which the passive component 125 is disposed, unlike the previous exemplary embodiment.

As described above, the blocking vias 143S and the blocking patterns 142S may have a form in which they surround the passive component 125 disposed in the cavity C, and may be arranged in various forms.

The respective components included in the semiconductor package 100 according to the present exemplary embodiment will hereinafter be described in more detail.

The frame 110 may further improve rigidity of the semiconductor package 100 depending on certain materials of the insulating layers 111a and 111b, and serve to secure uniformity of a thickness of the encapsulant 130. The frame 110 may have the through-hole 110H penetrating through the insulating layers 111a and 111b. The semiconductor chip 120 may be disposed in the through-hole 110H, and a passive component (not illustrated) may be disposed together with the semiconductor chip 120 in the through-hole 110H in some exemplary embodiments. The through-hole 110H may have a form in which walls thereof surround the semiconductor chip 120, but is not necessarily limited thereto.

The frame 110 used in the present exemplary embodiment may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the other surface of the first insulating layer 111a opposing the one surface of the first insulating layer 111a in which the first wiring layer 112a is embedded and covering at least portions of the second wiring layer 112b, and a third wiring layer 112c disposed on the other surface of the second insulating layer 111b opposing one surface of the second insulating layer 111b in which the second wiring layer 112b is embedded. The first and second wiring layers 112a and 112b and the second and third wiring layers 112b and 112c may be electrically connected to each other through first and second wiring vias 113a and 113b penetrating through the first and second insulating layers 111a and 111b, respectively. The first to third wiring layers 112a, 112b, and 112c may be electrically connected to the connection pads 120P through the redistribution layer 145 of the connection structure 140.

Figure 15:
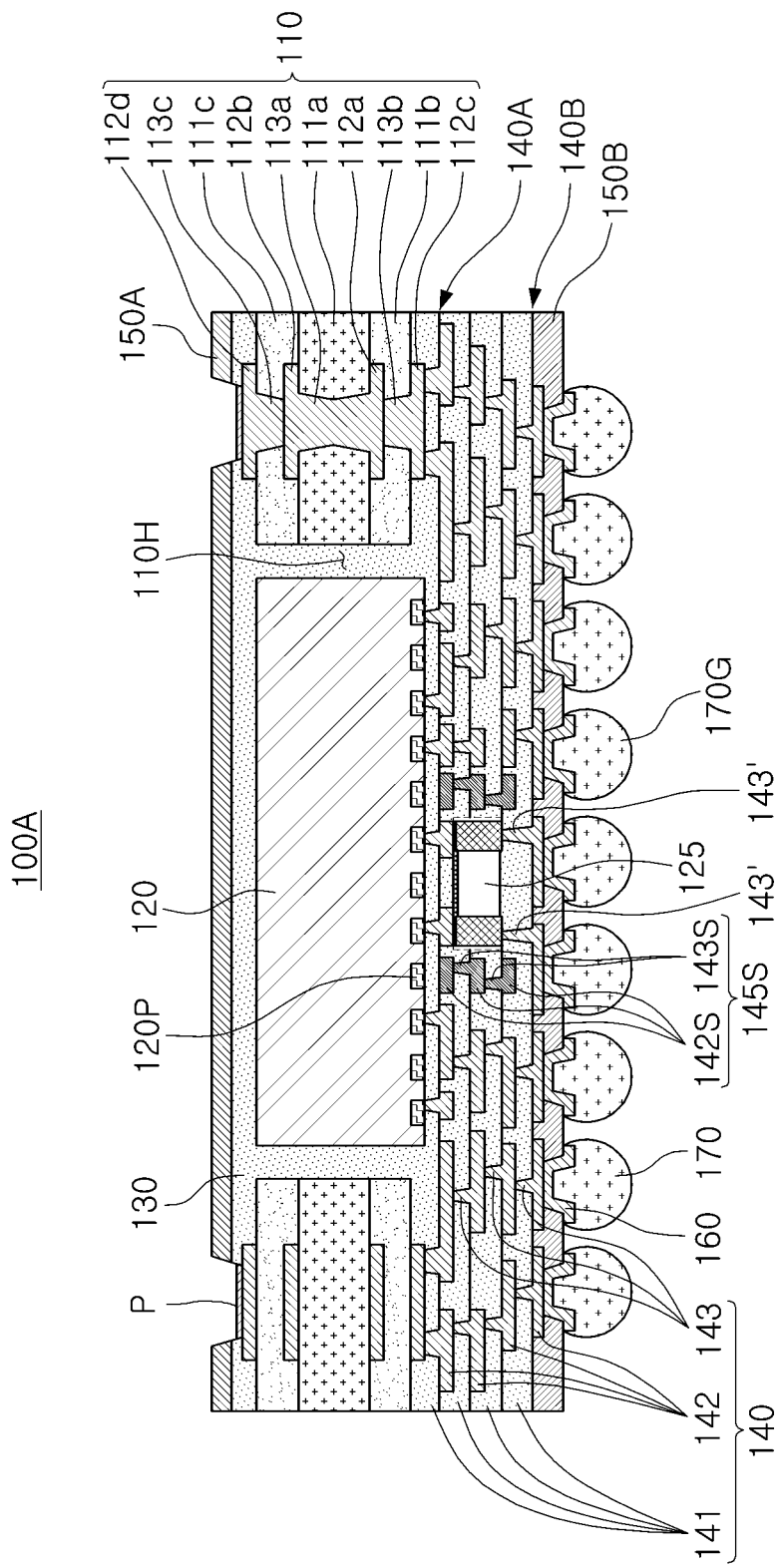
FIGS. 15 and 16 are schematic cross-sectional views illustrating semiconductor packages according to various other exemplary embodiments in the present disclosure.

A form in which the wiring structure used in the present exemplary embodiment includes three wiring layers 112a, 112b, and 112c and the wiring vias 113a and 113b connecting the three wiring layers 112a, 112b, and 112c to each other is exemplified, but the number of layers in the wiring structure may be different from that described above and various other wiring structures may be implemented (see, e.g., FIG. 15).

A material of each of the insulating layers 111a and 111b is not particularly limited. For example, an insulating material may be used as the material of each of the insulating layers 111a and 111b. In this case, a thermosetting resin such as an epoxy resin, a thermoplastic resin such as a polyimide resin, a resin in which the thermosetting resin and the thermoplastic resin are mixed with an inorganic filler, for example, Ajinomoto Build-up Film (ABF), or the like, may be used as the insulating material. Alternatively, a material in which the resin described above is impregnated together with an inorganic filler in a core material such as a glass fiber (or a glass cloth or a glass fabric), for example, prepreg, or the like, may also be used as the insulating material. In some exemplary embodiments, a photoimageable dielectric (PID) resin may also be used as the insulating material.

As described above, the wiring structure including the first to third wiring patterns 112a, 112b, and 112c and the first and second wiring vias 113a and 113b may provide a vertical connection path of the semiconductor package 100 and serve to redistribute the connection pads 120P of the semiconductor chip 120. A material of each of the first to third wiring patterns 112a, 112b, and 112c may be a conductive material such as copper (Cu), aluminum (Al), silver (Ag), tin (Sn), gold (Au), nickel (Ni), lead (Pb), titanium (Ti), or alloys thereof. The first to third wiring patterns 112a, 112b, and 112c may perform various functions depending on designs of corresponding layers. For example, the first to third wiring patterns 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring patterns 112a, 112b, and 112c may include via pads, wire pads, pads for electrical connection metals, and the like. Each of the first to third wiring patterns 112a, 112b, and 112c may be formed by a plating process, and may include a seed layer and a conductor layer. Thicknesses of the first to third wiring patterns 112a, 112b, and 112c may be greater than those of the redistribution layers 142.

The first and second wiring vias 113a and 113b may electrically connect the wiring layers 112a, 112b, and 112c formed on different layers to each other, resulting in an electrical path in the frame 110. A material of the first and second wiring vias 113a and 113b may be a conductive material such as copper (Cu), aluminum (Al), silver (Ag), tin (Sn), gold (Au), nickel (Ni), lead (Pb), titanium (Ti), or alloys thereof. Each of the first and second wiring vias 113a and 113b may be a filled-type via filled with the conductive material, or be a conformal-type via in which the conductive material may be formed along a wall of each of via holes. In addition, each of the first and second wiring vias 113a and 113b may have a tapered shape. Each of the first and second wiring vias 113a and 113b may be formed by a plating process, and may include a seed layer and a conductor layer.

When holes for the first wiring vias 113a are formed, portions of the first wiring pattern 112a may serve as a stopper. Therefore, it may be advantageous in a process that each of the first wiring vias 113a has a tapered shape of which a width of an upper end is greater than that of a lower end. In this case, the first wiring vias 113a may be integrated with the second wiring pattern 112b. In addition, when holes for the second wiring vias 113b are formed, portions of the second wiring pattern 112b may serve as a stopper. Therefore, it may be advantageous in a process that each of the second wiring vias 113b has a tapered shape of which a width of an upper end is greater than that of a lower end, similar to the first wiring via 113a. In this case, the second wiring vias 113b may be integrated with the third wiring pattern 112c. Meanwhile, although not illustrated in the drawings, in some exemplary embodiments, a metal layer (not illustrated) may be disposed on the walls of the through-hole 110H of the frame 110 in order to block electromagnetic waves or dissipate heat. The metal layer (not illustrated) may surround the semiconductor chip 120.

The semiconductor chip 120 may be an integrated circuit (IC) providing an amount of several hundred to several million or more elements integrated in a single chip. In this case, the IC may be, for example, an application processor chip such as a central processor (for example, a CPU), a graphic processor (for example, a GPU), a digital signal processor, a cryptographic processor, a micro processor, a micro controller, or the like, but is not limited thereto. The IC may be a power management IC (PMIC), a memory chip such as a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an integrated circuit in a bare state in which separate bumps or redistribution layers are not formed. However, the semiconductor chip 120 is not limited thereto, and may be a packaged-type IC. The integrated circuit may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer exposing the connection pads 120P may be formed on the body, and may be an oxide layer, a nitride layer, or the like, or a double layer of an oxide layer and a nitride layer. An insulating layer (not illustrated), and the like, may further be disposed in other appropriate positions. Meanwhile, an active surface of the semiconductor chip 120 refers to a surface of the semiconductor chip 120 on which the connection pads 120P are disposed, and an inactive surface of the semiconductor chip 120 refers to a surface of the semiconductor chip 120 opposing the active surface (in some embodiments, the inactive surface may be free of any connections pads, although in other embodiments the inactive surface can include connection pad(s)). In this case, when the passivation layer is formed on the active surface of the semiconductor chip 120, a position relationship of the active surface of the semiconductor chip 120 may be determined on the basis of a lower surface of the passivation layer.

The encapsulant 130 may encapsulate the frame 110 and the semiconductor chip 120, and may fill at least a portion of the through-hole 110H. The encapsulant 130 may be formed of an insulating material. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, Bismaleimide Triazine (BT), or the like. In addition, a molding material such as an epoxy molding compound (EMC) or a photosensitive material, that is, a photoimageable encapsulant (PIE) may be used as the insulating material. In some exemplary embodiments, a material in which an insulating resin such as a thermosetting resin or a thermoplastic resin is impregnated in an inorganic filler and/or a core material such as a glass fiber (or a glass cloth or a glass fabric) may also be used as the insulating material.

The connection structure 140 may be configured to redistribute the connection pads 120P of the semiconductor chip 120. Several tens to several hundreds of connection pads 120P of the semiconductor chip 120 having various functions may be redistributed by the connection structure 140, and may be physically or electrically externally connected through electrical connection metals 170 depending on functions. A form in which the connection structure 140 includes four insulating layers 141, four layers of redistribution patterns 142, and four layers of redistribution vias 143, as described above, is illustrated, but in another exemplary embodiment, the connection structure 140 may be implemented as a single layer or be implemented as a larger number of layers than those described above.

Each of the insulating layers 141 may be formed of the insulating material described above. Here, the insulating material may be a PID. In this case, a fine pitch may be introduced through a photo-via, and several tens to several millions of connection pads 120P of the semiconductor chip 120 may thus be very effectively redistributed.

The redistribution patterns 142 may redistribute the connection pads 120P of the semiconductor chip 120 to electrically connect the connection pads 120P to the electrical connection metals 170. A material of each of the redistribution patterns 142 may also be a conductive material such as copper (Cu), aluminum (Al), silver (Ag), tin (Sn), gold (Au), nickel (Ni), lead (Pb), titanium (Ti), or alloys thereof. The redistribution patterns 142 may perform various functions depending on their designs. For example, the redistribution patterns 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution patterns 142 may include via pads, electrical connection structure pads, and the like.

The redistribution vias 143 may electrically connect the redistribution patterns 142 formed on different layers to each other, and may be used particularly to electrically connect the connection pads 120P of the semiconductor chip 120 and the redistribution pattern 142 to each other. The redistribution vias 143 may be in physical contact with the connection pads 120P when the semiconductor chip 120 is a bare die. A material of each of the redistribution vias 143 may also be a conductive material such as copper (Cu), aluminum (Al), silver (Ag), tin (Sn), gold (Au), nickel (Ni), lead (Pb), titanium (Ti), or alloys thereof. Each of the redistribution vias 143 may also be completely filled with the conductive material, or the conductive material may also be formed along a wall of each of via holes. In addition, each of the redistribution vias 143 may also have a tapered shape.

First and second passivation layers 150A and 151 may be provided as layers for protecting the semiconductor package 100 from external physical or chemical damage. In detail, the first passivation layer 150A positioned on a lower level may protect the connection structure 140, and the second passivation layer 150B positioned on a higher level may be disposed on the encapsulant 130. The first and second passivation layers 150A and 150B may have openings that open portions of the redistribution layer 142 and portions of the wiring structure (particularly, the third wiring pattern 112c). Opened regions of the third wiring pattern 112c may include a surface treatment layer P formed in order to serve as a pad. The surface treatment layer P is not particularly limited, and may be formed by, for example, electrolytic gold plating, electroless gold plating, organic solderability preservative (OSP) or electroless tinplating, electroless silver plating, electroless nickel plating/substituted gold plating, direct immersion gold (DIG) plating, hot air solder leveling (HASL), or the like, but is not limited thereto.

Each of the first and second passivation layers 150A and 150B may include an insulating resin and an inorganic filler, but may not include a glass fiber. For example, the first and second passivation layers 150A and 150B may be formed of ABF, but are not limited thereto, and may be formed of a PID.

Underbump metal layers 160 may be used in order to improve connection reliability of the electrical connection metals 170. That is, the underbump metal layers 160 may improve board level reliability of the semiconductor package 100 according to the present exemplary embodiment. The number of underbump metal layers 160 may be several tens to several tens of thousands. The respective underbump metal layers 160 may be connected to the wiring structure. The underbump metal layers 160 may be formed by a metallization method using a metal, but are not limited thereto, in each of a plurality of openings extending through the first passivation layer 150A.

The electrical connection metals 170 may be configured to physically or electrically externally connect the semiconductor package 100. For example, the semiconductor package 100 may be mounted on the mainboard of the electronic device through the electrical connection metals 170. Each of the electrical connection metals 170 may be formed of a low melting point metal such as tin (Sn) or alloys including tin (Sn). In more detail, each of the electrical connection metals 170 may be formed of a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 120P, or may be provided in an amount of several tens to several thousands or more or several tens to several thousands or less.

The electrical connection metal 170 may include a ground connection metal 170G. The ground connection metal 170G may be connected to the blocking via 143S and/or the blocking pattern 142S. When the semiconductor package 100 is mounted on an external apparatus such as a motherboard, the ground connection metal 170G may be connected to a ground of the motherboard.

At least one of the electrical connection metals 170 may be disposed in a fan-out region. The fan-out region refers to a region that does not overlap a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

FIG. 15 is a schematic cross-sectional view illustrating a semiconductor package according to another exemplary embodiment.

Referring to FIG. 15, it may be understood that a semiconductor package 100A according to the present exemplary embodiment has a structure similar to that illustrated in FIGS. 9 through 14 except for a form of a wiring structure of a frame 110. Components according to the present exemplary embodiments may be understood with reference to the description for the same or similar components of the semiconductor package 100 illustrated in FIGS. 9 through 14 unless explicitly described otherwise.

A frame 110 used in the present exemplary embodiment may have a structure different from that of the frame 110 described above, and a wiring structure of the frame 110 may thus be modified. In detail, the frame 110 may include a first insulating layer 111a, second and third insulating layers 111b and 111c disposed on opposite surfaces of the first insulating layer 111a, respectively, and a wiring structure formed on the first to third insulating layers 111a, 111b, and 111c. The wiring structure may include a first wiring layer 112a disposed on one surface of the first insulating layer 111a, a second wiring layer 112b disposed on the other surface of the first insulating layer 111a opposite the one surface, a third wiring layer 112c disposed on the other surface of the second insulating layer 111b opposing one surface of the second insulating layer 111b in which the first wiring layer 112a is embedded, a fourth wiring layer 112d disposed on the other surface of the third insulating layer 111c opposing one surface of the third insulating layer 111c in which the second wiring layer 112b is embedded, first wiring vias 113a penetrating through the first insulating layer 111a and electrically connecting the first and second wiring layers 112a and 112b to each other, second wiring vias 113b penetrating through the second insulating layer 111b and electrically connecting the first and third wiring layers 112a and 112c to each other, and third wiring vias 113c penetrating through the third insulating layer 111c and electrically connecting the second and fourth wiring layers 112b and 112d to each other.

Since the frame 110 used in the present exemplary embodiment has a larger number of wiring layers 112a, 112b, 112c, and 112d, redistribution layers 145 of a connection structure 140 may further be simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be an ABF or a PID including an inorganic filler and an insulating resin. However, the materials of the first insulating layer 111a and the second and third insulating layers 111b and 111c are not limited thereto.

The first wiring vias 113a penetrating through the first insulating layer 111a may have a diameter greater than those of the second and third wiring vias 113b and 113c each penetrating through the second and third insulating layers 111b and 111c. In addition, the first wiring via 113a may have an hourglass shape or a cylindrical shape, while the second and third wiring vias 113b and 113c may have tapered shapes of which directions are opposite to each other. Thicknesses of the first to fourth wiring layers 112a, 112b, 112c, and 112d may be greater than those of the redistribution layers 145.

Figure 16:
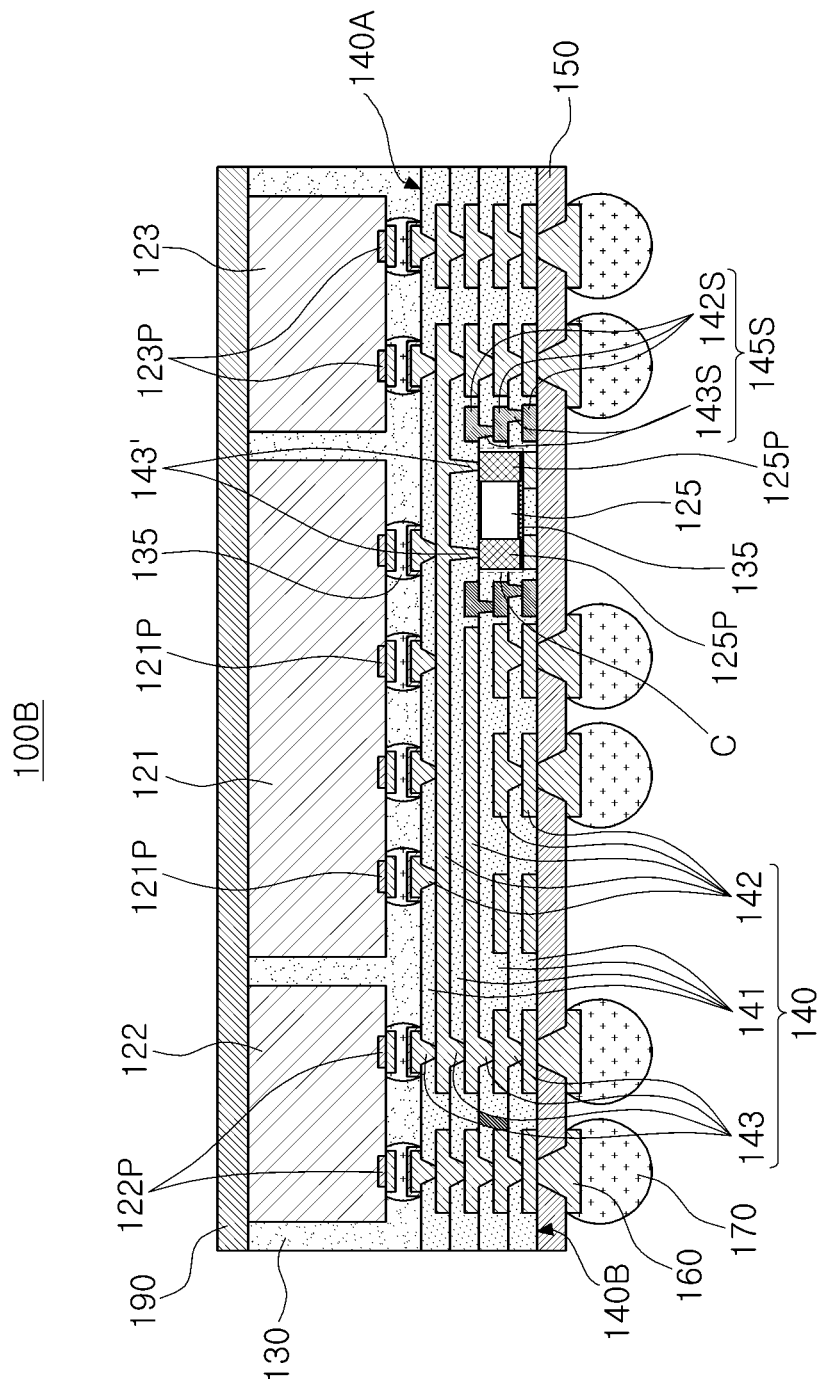

FIG. 16 is a schematic cross-sectional view illustrating a semiconductor package according to another exemplary embodiment.

Referring to FIG. 16, a semiconductor package 100B according to the present exemplary embodiment may be different from the semiconductor packages according to the previous exemplary embodiments in which the connection structure is formed on the active surface of the semiconductor chip in that semiconductor chips 121, 122, and 123 are mounted after a connection structure 140 is manufactured.

Referring to FIG. 16, a semiconductor package 100B according to the present exemplary embodiment may include a connection structure 140 having a first surface 140A and a second surface 140B opposing each other, first to third semiconductor chips 121, 122, and 123 disposed on the first surface 140A of the connection structure 140, and an encapsulant 130 disposed on the first surface 140A of the connection structure 140 and encapsulating the first to third semiconductor chips 121, 122, and 123.

The connection structure 140 may be used as an interposer packaging the first to third semiconductor chips 121, 122, and 123 in order to mount the semiconductor package 100B on a motherboard. The connection structure 140 may include a plurality of insulating layers 141, a plurality of redistribution patterns 142 each disposed on the plurality of insulating layers 141, and a plurality of redistribution vias 143 each penetrating through the plurality of insulating layers 141 and connected to the plurality of redistribution patterns 142.

At least one passive component 125 may be embedded in a cavity C of the connection structure 140 used in the present exemplary embodiment. Blocking wiring structures 145S may be arranged to surround the passive component 125 embedded in the connection structure 140 in order to block EMI. The blocking wiring structures 145S may include a plurality of blocking vias 143S disposed to surround the cavity and blocking patterns 142S connecting adjacent blocking vias to each other. The redistribution vias 143 and the blocking via 143S may have a structure in which they are tapered in an opposite direction to that of the redistribution via and the blocking via used in the exemplary embodiment illustrated in FIG. 9.

A redistribution pattern 142 positioned on the first surface 140A of the connection structure among the plurality of redistribution patterns 142 may be provided as a connection wiring layer connected to each of connection pads 121P, 122P, and 123P of the first to third semiconductor chips 121, 122, and 123.

The connection pads 121P, 122P, and 123P of the first to third semiconductor chips 121, 122, and 123 may be electrically connected to the connection wiring layer of the plurality of redistribution patterns 142 using connection members 135, respectively. Each of the connection members 135 may be formed of a low melting point metal such as tin (Sn) or alloys including tin (Sn).

In addition, the semiconductor package 100B may include an underfill resin (not illustrated) disposed between surfaces (hereinafter, referred to as active surfaces) of the first to third semiconductor chips 121, 122, and 123 on which the connection pads are formed and the first surface 140A of the connection structure 140. The underfill resin (not illustrated) may stably fix the first to third semiconductor chips 121, 122, and 123 onto the connection structure 140. For example, the underfill resin (not illustrated) may be a thermosetting resin such as epoxy, or the like.

The encapsulant 130 may be formed so that upper surfaces of the first to third semiconductor chips 121, 122, and 123 are exposed through an upper surface of the encapsulant 130. Heat may be easily dissipated through the exposed upper surfaces. The upper surfaces of the semiconductor chips 121, 122, and 123 and the upper surface of the encapsulant 130 may be substantially coplanar with each other by a polishing process.

A heat dissipation plate 190 may be disposed on the coplanar surface using a thermally conductive bonding layer. Here, the thermally conductive bonding layer may be formed of a thermal interface material (TIM), for example, an epoxy resin. The heat dissipation plate 190 may be, for example, a heat sink, a heat spreader, a heat pipe, or a liquid cooled cold plate.

The semiconductor package 100B may include a plurality of electrical connection metals 170 disposed on the second surface 140B of the connection structure 140 and each connected to the redistribution pattern 142. The plurality of electrical connection metals 170 may include one or more ground connection metals connected to the blocking vias 143S or the blocking patterns 142S. The semiconductor package 100B may include underbump metal layers 160 connecting the plurality of electrical connection metals 170 and the redistribution pattern 142 to each other. The semiconductor package 100B according to the present exemplary embodiment may include a passivation layer 150 disposed on the second surface 140B of the connection structure 140 and embedding at least portions of the underbump metal layers 160.

Figure 17:
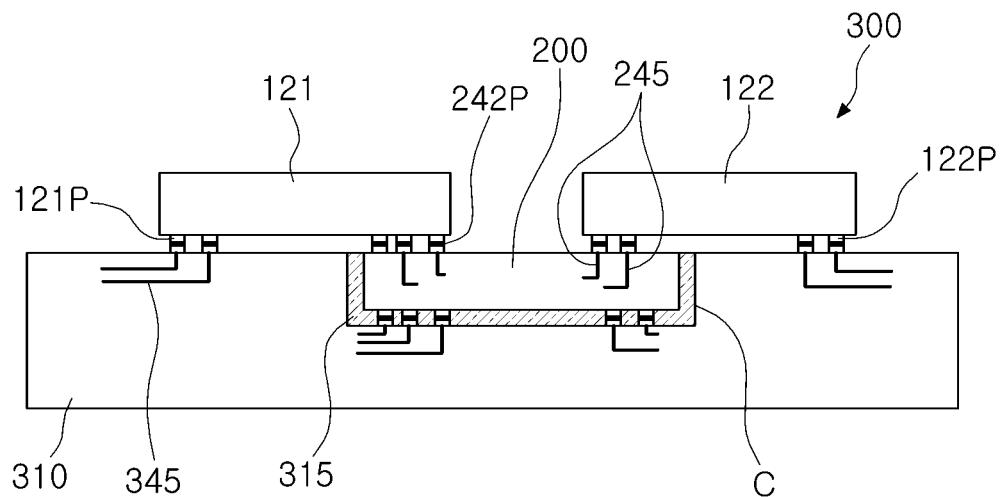
FIG. 17 is a schematic cross-sectional view illustrating a semiconductor package according to another exemplary embodiment in the present disclosure.
Figure 18:
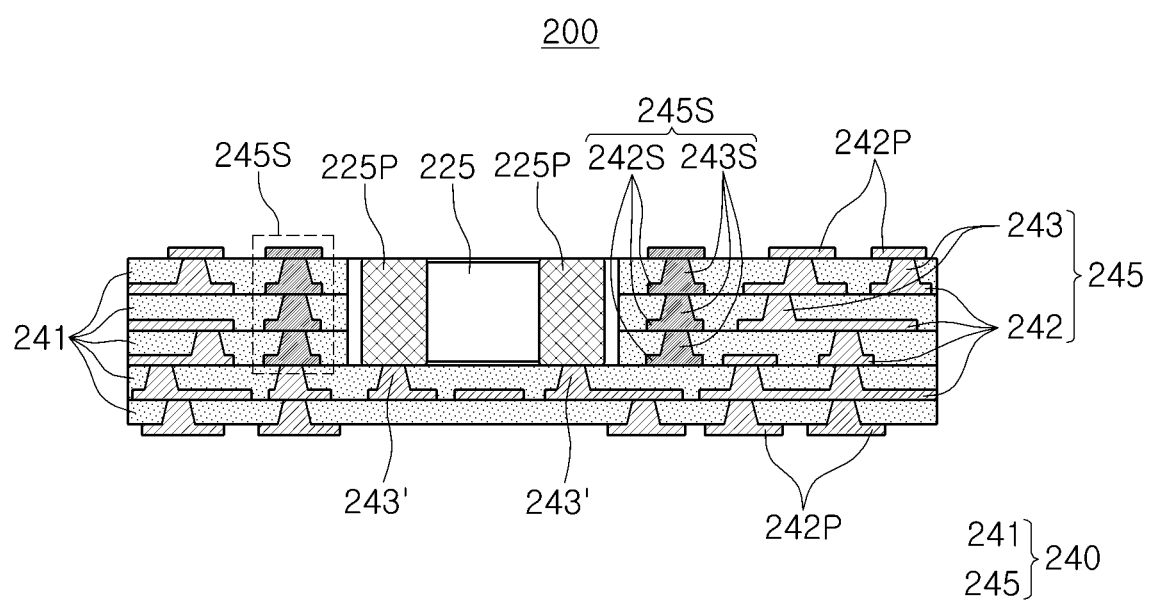
FIG. 18 is a cross-sectional view illustrating a bridge used in the semiconductor package of FIG. 17.

FIG. 17 is a schematic cross-sectional view illustrating a semiconductor package according to another exemplary embodiment, and FIG. 18 is a cross-sectional view illustrating a bridge used in the semiconductor package of FIG. 17.

Referring to FIGS. 17 and 18, a semiconductor package 300 according to the present exemplary embodiment may include a substrate 310 having an interconnection structure 345 and having a cavity C, a bridge 200 disposed in the cavity C, and first and second semiconductor chips 121 and 122 each disposed on the substrate 100 to be connected to the interconnection structure 345.

As illustrated in FIG. 18, the bridge 200 may include a connection structure 240 and a passive component 225 embedded in the connection structure 240. The connection structure 240 may include a plurality of insulating layers 241 and redistribution layers 245 disposed on the plurality of insulating layers 241, and the passive component 225 may have connection terminals 225P connected to the redistribution layers 245. In the present exemplary embodiment, the connection terminals 225P of the passive component 225 may be connected to redistribution vias 243' disposed on one surfaces thereof. The first and second semiconductor chips 121 and 122 may be electrically connected to each other through the redistribution layers 245 of the bridge 200. The bridge 200 may be disposed in the cavity C and be mounted by a bonding layer 315. The bridge 200 may be electrically connected to a portion of the interconnection structure 345 positioned on a bottom surface of the cavity C.

The redistribution layers 245 may include a plurality of redistribution patterns 242 each disposed on the plurality of insulating layers 241 and a plurality of redistribution vias 243 each penetrating through the plurality of insulating layers 241 and connected to the plurality of redistribution patterns 242, similar to the exemplary embodiment described above. Certain redistribution patterns 242 may be disposed on (or exposed to) upper and lower surfaces of the bridge 200, and may serve as connection pads 242P for establishing connections to connection pads 121P and 122P of the semiconductor chips 121 and 122, and connections to the interconnection structure 345 of the substrate 310.

The bridge 200 according to the present exemplary embodiment may provide blocking wiring structures 245S for the passive component 225. The blocking wiring structures 245S may include some of the redistribution vias 243 and some of the redistribution patterns 242. In detail, the plurality of redistribution vias 243 may include a plurality of blocking vias 243S arranged to surround the passive component 225, and the plurality of redistribution patterns 242 may include blocking patterns 242S connected to adjacent blocking vias 243S in the plurality of insulating layers 241.

As described above, the blocking vias 243S and the blocking patterns 242S may be arranged to surround the passive component 225 disposed in the cavity C to provide an EMI blocking effect. The blocking vias 243S and the blocking patterns 242S may be arranged in various forms, as described above with reference to FIGS. 11 through 14.

As set forth above, according to an exemplary embodiment in the present disclosure, the blocking vias surrounding the component embedded in the connection structure and the blocking patterns connected to the blocking vias may be introduced to provide an effective EMI blocking structure for the embedded component.

While exemplary embodiments have been shown and described above, it will be apparent to those skilled in the art that modifications and variations could be made without departing from the scope of the present invention as defined by the appended claims.

What is claimed is:

1. A semiconductor package comprising:
a connection structure having a first surface and a second surface opposing each other and including a plurality of insulating layers and redistribution layers disposed on the plurality of insulating layers;
a semiconductor chip disposed on the first surface of the connection structure and having connection pads connected to the redistribution layers;
an encapsulant disposed on the first surface of the connection structure and encapsulating the semiconductor chip; and
a passive component embedded in the connection structure and having connection terminals connected to the redistribution layers,
wherein the redistribution layers include a plurality of redistribution patterns, each of the redistribution patterns disposed on a respective insulating layer of the plurality of insulating layers, and a plurality of redistribution vias each penetrating through a respective insulating layer of the plurality of insulating layers and connected to redistribution patterns of the plurality of redistribution patterns,
wherein the plurality of redistribution vias include a plurality of blocking vias arranged to surround the passive component in a horizontal direction, and the plurality of redistribution patterns include a blocking pattern connected to adjacent blocking vias, and
wherein the blocking vias and the blocking patterns are configured to block electromagnetic interference (EMI).

2. The semiconductor package of claim 1, wherein the plurality of insulating layers include a cavity in which the passive component is mounted, and the blocking vias are arranged to surround the cavity.

3. The semiconductor package of claim 1, wherein the plurality of blocking vias are arranged so that blocking vias disposed on adjacent different insulating layers overlap each other in a vertical direction.

4. The semiconductor package of claim 1, wherein the plurality of blocking vias are arranged so that centers of blocking vias disposed on adjacent different insulating layers are offset from each other.

5. The semiconductor package of claim 1, wherein the blocking pattern is a single pattern extending around an entire periphery of the passive component.

6. The semiconductor package of claim 1, wherein the blocking pattern includes a plurality of patterns arranged to surround the passive component.

7. The semiconductor package of claim 1, wherein the connection terminals of the passive component are connected to redistribution patterns or redistribution vias disposed on an insulating layer adjacent to one surface of the passive component among the plurality of insulating layers.

8. The semiconductor package of claim 7, wherein the passive component is bonded by an adhesive layer to an insulating layer adjacent to another surface of the passive component opposite to the one surface among the plurality of insulating layers.

9. The semiconductor package of claim 1, wherein the redistribution layers further include ground patterns, and the blocking vias or the blocking patterns are connected to the ground patterns.

10. The semiconductor package of claim 1, further comprising a plurality of electrical connection metals disposed on the second surface of the connection structure and each connected to the redistribution layer,
wherein the plurality of electrical connection metals include ground connection metals connected to the blocking vias or the blocking patterns.

11. The semiconductor package of claim 10, further comprising underbump metal (UBM) layers disposed on the second surface of the connection structure and connecting the plurality of electrical connection metals and the redistribution layer to each other.

12. The semiconductor package of claim 1, further comprising a frame disposed on the first surface of the connection structure, the frame having a through-hole in which the semiconductor chip is disposed, and the frame having a wiring structure disposed therein connected to the redistribution layer.

13. The semiconductor package of claim 12, wherein the frame includes first and second insulating layers sequentially disposed on the first surface of the connection structure, and
the wiring structure includes a first wiring pattern embedded in one surface of the first insulating layer, a second wiring pattern disposed on another surface of the first insulating layer opposing the one surface of the first insulating layer, a third wiring pattern disposed on one surface of the second insulating layer opposing another surface of the second insulating layer on which the second wiring pattern is disposed, first wiring vias penetrating through the first insulating layer and connecting the first and second wiring patterns to each other, and second wiring vias penetrating through the second insulating layer and connecting the second and third wiring patterns to each other.

14. The semiconductor package of claim 12, wherein the frame includes a first insulating layer and second and third insulating layers disposed on opposite surfaces of the first insulating layer, respectively, and
the wiring structure includes first and second wiring patterns disposed on the opposite surfaces of the first insulating layer, respectively, a third wiring pattern disposed on the second insulating layer, a fourth wiring pattern disposed on the third insulating layer, first wiring vias penetrating through the first insulating layer and connecting the first and second wiring patterns to each other, second wiring vias penetrating through the second insulating layer and connecting the second and third wiring patterns to each other, and third wiring vias penetrating through the third insulating layer and connecting the third and fourth wiring patterns to each other.

15. A semiconductor package comprising:
a substrate having an interconnection structure and having a cavity;
a bridge disposed in the cavity and including a connection structure and a passive component, the connection structure including a plurality of insulating layers and redistribution layers disposed on the plurality of insulating layers, and the passive component being embedded in the connection structure and having connection terminals connected to the redistribution layers; and
first and second semiconductor chips each disposed on the substrate to be connected to the interconnection structure of the substrate and electrically connected to each other through the redistribution layers of the bridge,
wherein the redistribution layers include a plurality of redistribution patterns, each of the redistribution patterns disposed on a respective insulating layer of the plurality of insulating layers, and a plurality of redistribution vias each penetrating through a respective insulating layer of the plurality of insulating layers and connected to the plurality of redistribution patterns, and
wherein the plurality of redistribution vias include a plurality of blocking vias arranged to surround the passive component in a horizontal direction, and the plurality of redistribution patterns include blocking patterns connected to adjacent blocking vias in the plurality of insulating layers,.
wherein the blocking vias and the blocking patterns are configured to block electromagnetic interference (EMI).

16. The semiconductor package of claim 15, wherein the bridge is electrically connected to a portion of the interconnection structure positioned on a bottom surface of the cavity.

17. A connection structure having opposing first and second surfaces and configured to have a semiconductor chip mounted on the first surface thereof, the connection structure comprising:
a plurality of insulating layers sequentially stacked between the first and second surfaces;
a plurality of redistribution layers including redistribution patterns disposed between respective insulating layers of the plurality of insulating layers; and
a plurality of redistribution vias extending through respective insulating layers of the plurality of insulating layers to interconnect distribution layers of the plurality of redistribution layers,
wherein the connection structure includes a cavity disposed between the first and second surfaces and extending through at least first and second insulating layers of the plurality of insulating layers to have a passive component disposed therein, and
wherein the plurality of redistribution vias include a plurality of blocking vias arranged to surround the cavity in a horizontal direction, and the plurality of redistribution patterns include a blocking pattern connected to adjacent blocking vias, and
wherein the blocking vias and the blocking patterns are configured to block electromagnetic interference (EMI).

18. The connection structure of claim 17, wherein the redistribution pattern on each of the first and second insulating layers continuously extends around an entire periphery of the cavity.

19. The connection structure of claim 17, wherein first and second redistribution patterns, respectively disposed on the first and second insulating layers adjacently to the cavity, are connected to each other by a plurality of redistribution vias that are evenly spaced from each other along the first and second redistribution patterns.

20. The connection structure of claim 17, wherein a third insulating layer of the plurality of insulating layers contacts and extends along a surface of the cavity, and a third redistribution pattern disposed adjacently to the cavity on the third insulating layer is connected to each of first and second redistribution patterns respectively disposed on the first and second insulating layers adjacently to the cavity.

* * * * *